(12) United States Patent
Treskunov et al.

(10) Patent No.: US 11,348,322 B1
(45) Date of Patent: May 31, 2022

(54) TRACKING AN ONGOING CONSTRUCTION BY USING FIDUCIAL MARKERS

(71) Applicant: DOXEL, INC., Palo Alto, CA (US)

(72) Inventors: Anton Treskunov, Santa Clara, CA (US); Robin Singh, Sunnyvale, CA (US)

(73) Assignee: Doxel, Inc., Palo Alto, CA (US)

( * ) Notice: Subject to any disclaimer, the term of this patent is extended or adjusted under 35 U.S.C. 154(b) by 287 days.

(21) Appl. No.: 16/680,377

(22) Filed: Nov. 11, 2019

Related U.S. Application Data

(60) Provisional application No. 62/758,295, filed on Nov. 9, 2018.

(51) Int. Cl.
| | | |
|---|---|---|
| *G06T 19/20* | (2011.01) | |
| *G06F 30/13* | (2020.01) | |
| *G06T 17/10* | (2006.01) | |
| *G06T 15/20* | (2011.01) | |
| *G05D 1/02* | (2020.01) | |
| *G06T 7/521* | (2017.01) | |
| *G01S 17/89* | (2020.01) | |

(52) U.S. Cl.
CPC .............. *G06T 19/20* (2013.01); *G01S 17/89* (2013.01); *G05D 1/024* (2013.01); *G06F 30/13* (2020.01); *G06T 7/521* (2017.01); *G06T 15/205* (2013.01); *G06T 17/10* (2013.01); *G05D 2201/0207* (2013.01); *G06T 2207/10028* (2013.01); *G06T 2207/30208* (2013.01)

(58) Field of Classification Search
CPC ....... G06T 19/20; G06T 7/521; G06T 15/205; G06T 17/10; G06T 2207/30208; G06T 2207/10028; G01S 17/89; G06F 30/13; G05D 1/024; G05D 2201/0207
See application file for complete search history.

(56) References Cited

U.S. PATENT DOCUMENTS

| | | | | |
|---|---|---|---|---|
| 9,182,487 | B2* | 11/2015 | Troy .................... | G01N 29/043 |
| 9,275,302 | B1* | 3/2016 | Yan ........................ | G06K 9/3241 |
| 10,706,321 | B1* | 7/2020 | Chen .................... | G06T 3/4007 |
| 2013/0096873 | A1* | 4/2013 | Rosengaus ........... | G01C 15/002 |
| | | | | 702/151 |
| 2013/0250042 | A1* | 9/2013 | Raghoebardayal ... | A63F 13/213 |
| | | | | 348/36 |
| 2018/0335520 | A1* | 11/2018 | Tofte .................... | G01S 7/4808 |
| 2020/0397537 | A1* | 12/2020 | Raby ..................... | B33Y 50/02 |

* cited by examiner

*Primary Examiner* — Christopher M Brandt
(74) *Attorney, Agent, or Firm* — Perkins Coie LLP; Alberto Araiza

(57) ABSTRACT

The disclosed embodiments include a method for automating alignment of image data captured of a three-dimensional (3D) physical structure with a computer model of the 3D physical structure. The method can include obtaining two-dimensional (2D) images of the 3D physical structure undergoing construction, detecting fiducial markers corresponding to control points in the 2D images, and determining a transformation function based on the control points. The method can further include obtaining more 2D images, detecting other fiducial markers, and aligning image data to a computer model by utilizing the transformation function. The method can further include refining an alignment by utilizing a refinement transformation based on 3D physical elements of the 3D physical structure.

32 Claims, 11 Drawing Sheets

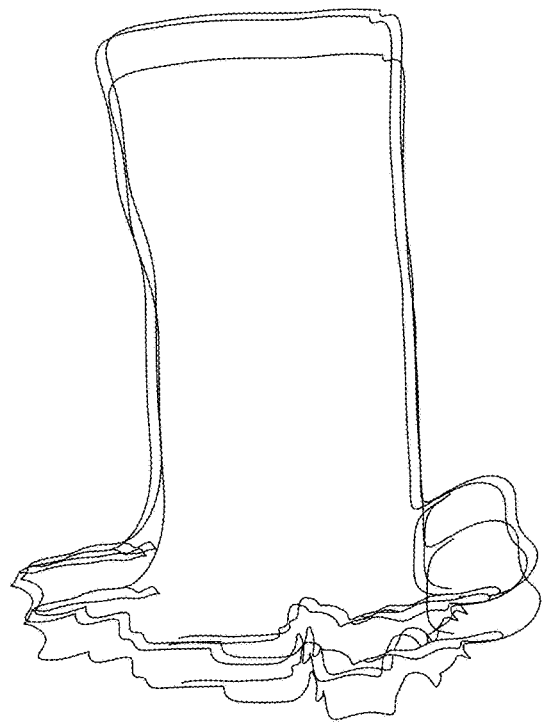 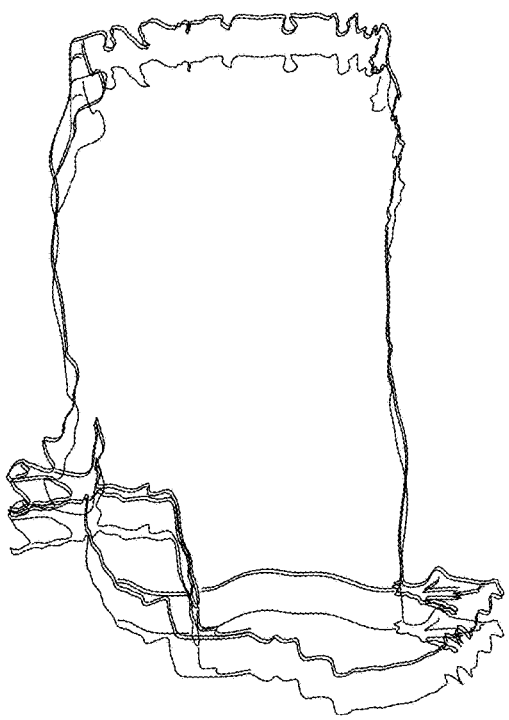
*FIG. 8A*        *FIG. 8B*

US 11,348,322 B1

TRACKING AN ONGOING CONSTRUCTION BY USING FIDUCIAL MARKERS

CROSS-REFERENCE OF RELATED APPLICATION

The present application claims benefit of U.S. Provisional Application Ser. No. 62/758,295, filed on Nov. 9, 2018, entitled "Utilizing Fiducial Markers to Automate Repetitive Alignments of Data from Scan Images and a Computer Model," which is hereby incorporated by reference in its entirety.

TECHNICAL FIELD

The disclosed teachings generally relate to automating repetitive alignments of data from scan images of an ongoing construction and a computer model of that construction. The disclosed teachings more particularly relate to utilizing fiducial markers in scan images of an ongoing construction of a structure to automate alignment with a computer model of that structure so that, for example, deviations between an actual and expected structure can be readily determined.

BACKGROUND

Constructing complex structures, such as buildings, requires the proper installation or assembly of many components. Construction workers need to properly locate and install or assemble numerous components, such as beams, pipes, ducts, studs, walls, etc. For example, some complex structures have millions of components that need to be installed at a location within an accuracy of an eighth of an inch, or even less in some cases. Unfortunately, the construction process is subject to errors, which can cause significant amounts of re-work and schedule delays. For example, a wall may be installed at a wrong location. If the error is not detected in a timely fashion, a significant amount of re-work may result. For example, a plumber may run water lines through the improperly located wall, an electrician may run electrical wires through the improperly located wall, a carpenter may add sheetrock to the improperly located wall, etc. When the error is detected, the wall may need to be demolished and rebuilt in the proper location in order to rectify the error, and the water lines, electrical wires, and sheetrock, may need to be reinstalled. Such errors may cause significant schedule delays and may result in significant additional costs for the construction project. Similar issues exist in the construction of other complex structures, such as airplanes, ships, submarines, space vehicles, etc.

SUMMARY

The disclosed embodiments include a method for automating alignment of image data captured of a three-dimensional (3D) physical structure with a computer model of the 3D physical structure. The method can include obtaining two-dimensional (2D) images of the 3D physical structure undergoing construction, detecting fiducial markers corresponding to control points in the 2D images, and determining a transformation function based on the control points. The method can further include obtaining more 2D images, detecting other fiducial markers, and aligning image data to a computer model by utilizing the transformation function. The method can further include refining an alignment by utilizing a refinement transformation based on 3D physical elements of the 3D physical structure.

Other aspects of the technique will be apparent from the accompanying Figures and Detailed Description.

This Summary is provided to introduce a selection of concepts in a simplified form that is further described below in the Detailed Description. This Summary is not intended to identify key features or essential features of the embodiments, nor is it intended to be used to limit the scope of the embodiments.

BRIEF DESCRIPTION OF THE DRAWINGS

Various features and characteristics of the technology will become more apparent to those skilled in the art from a study of the Detailed Description in conjunction with the drawings. Embodiments of the technology are illustrated by way of example and not limitation in the drawings, in which like references may indicate similar elements.

FIG. 8A depicts an image of a 3D physical element in a 3D physical structure used to refine an alignment of the 3D physical structure.

FIG. 8B depicts another image of a 3D physical element in a 3D physical structure used to refine an alignment of the 3D physical structure.

Figure 1:
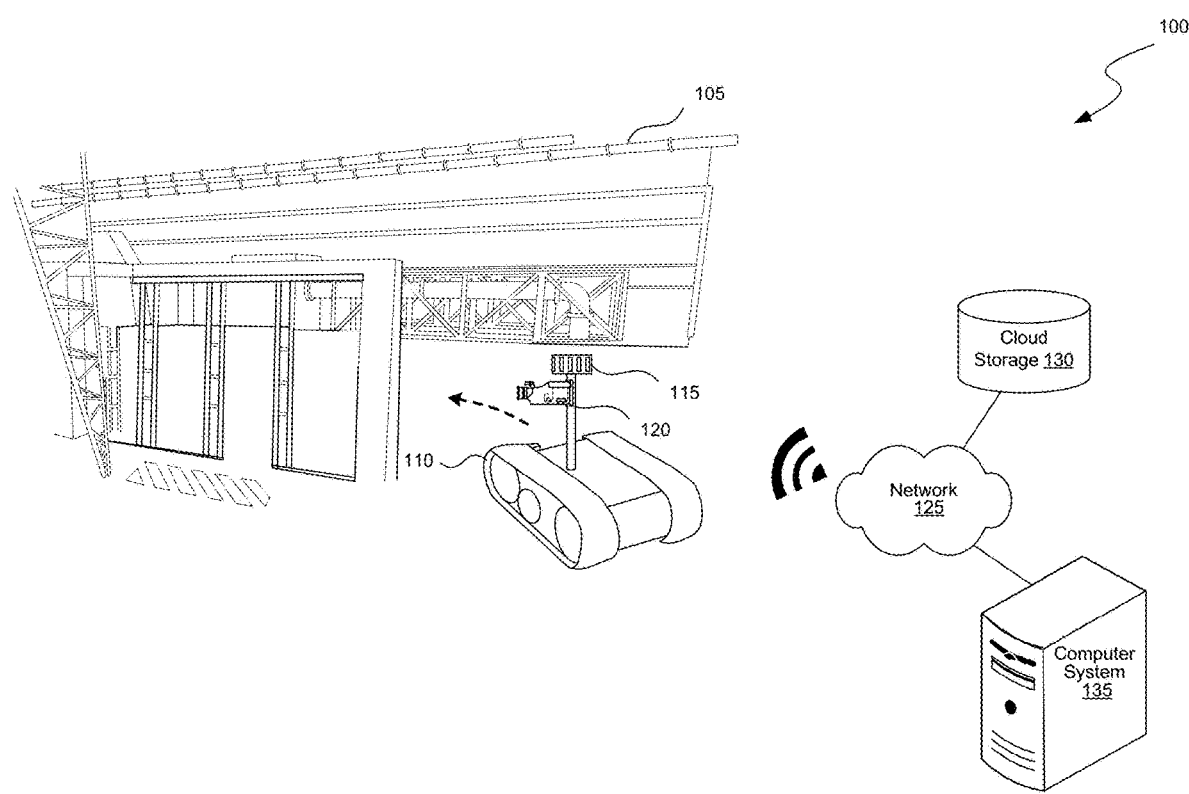
FIG. 1 is a system diagram that illustrates an environment in which a construction monitoring system is implemented.

The drawings depict various embodiments for the purpose of illustration only. Those skilled in the art will recognize that alternative embodiments may be employed without departing from the principles of the technology. Accordingly, while specific embodiments are shown in the drawings, the technology is amenable to various modifications.

DETAILED DESCRIPTION

The embodiments set forth below represent the necessary information to enable those skilled in the art to practice the embodiments and illustrate the best mode of practicing the embodiments. Upon reading the following description in light of the accompanying figures, those skilled in the art will understand the concepts of the disclosure and will recognize applications of these concepts that are not particularly addressed herein. These concepts and applications fall within the scope of the disclosure and the accompanying claims.

The disclosed technology can be embodied using special-purpose hardware (e.g., circuitry), programmable circuitry appropriately programmed with software and/or firmware, or a combination of special-purpose hardware and programmable circuitry. Accordingly, embodiments may include a machine-readable medium having instructions that may be used to program a computing device to examine video content generated by an electronic device, identify elements included in the video content, apply a classification model to determine an appropriate action, and perform the appropriate action.

The purpose of terminology used herein is only for describing embodiments and is not intended to limit the scope of the disclosure. Where context permits, words using the singular or plural form may also include the plural or singular form, respectively.

As used herein, unless specifically stated otherwise, terms such as "processing," "computing," "calculating," "determining," "displaying," "generating," or the like, refer to actions and processes of a computer or similar electronic computing device that manipulates and transforms data represented as physical (electronic) quantities within the computer's memory or registers into other data similarly represented as physical quantities within the computer's memory, registers, or other such storage medium, transmission, or display devices.

As used herein, terms such as "connected," "coupled," or the like, may refer to any connection or coupling, either direct or indirect, between two or more elements. The coupling or connection between the elements can be physical, logical, or a combination thereof.

References to "an embodiment" or "one embodiment" means that the particular feature, function, structure, or characteristic being described is included in at least one embodiment. Occurrences of such phrases do not necessarily refer to the same embodiment, nor are they necessarily referring to alternative embodiments that are mutually exclusive of one another.

Unless the context clearly requires otherwise, the words "comprise" and "comprising" are to be construed in an inclusive sense rather than an exclusive or exhaustive sense (i.e., in the sense of "including but not limited to").

As used herein, the term "based on" is also to be construed in an inclusive sense rather than an exclusive or exhaustive sense. Thus, unless otherwise noted, the term "based on" is intended to mean "based at least in part on."

As used herein, the term "module" may refer to software components, hardware components, and/or firmware components. Modules are typically functional components that can generate useful data or other output(s) based on specified input(s). A module may be self-contained. A computer program may include one or more modules. Thus, a computer program may include multiple modules responsible for completing different tasks or a single module responsible for completing multiple tasks.

When used in reference to a list of multiple items, the word "or" is intended to cover all of the following interpretations: any of the items in the list, all of the items in the list, and any combination of items in the list.

The sequences of steps performed in any of the processes described herein are exemplary. However, unless contrary to physical possibility, the steps may be performed in various sequences and combinations. For example, steps could be added to, or removed from, the processes described herein. Similarly, steps could be replaced or reordered. Thus, descriptions of any processes are intended to be open-ended.

Introduced herein is a technique for using fiducial markers to automate repetitive alignments of data from images of a three-dimensional (3D) structure relative to a computer model of the 3D structure. This involves monitoring construction of a structure, such as a building. In an example, the process of constructing a building starts with designing the building and planning the construction of the building. The process of designing the building includes capturing the design of the building via one or more computer-aided-design (CAD) applications. A CAD application can be a 3D or 2D CAD application, among others.

For example, the design of the supporting structure of a building may be captured via a 3D CAD application that supports structural analysis, such as by determining the effects of loads and stresses on structures and their components. The plumbing design may be captured via a 3D CAD application optimized for analysis and construction of plumbing components. The electrical design may be captured via a 2D CAD application optimized for analysis and construction of electrical components. Electrical components that are input via a 2D CAD application can be annotated with a physical attribute(s), such as elevation, depth, etc., which can be used to determine 3D locations of the components.

Once the construction project is under way, construction crews construct the building as indicated by the building design data captured by the various CAD applications. On a periodic basis, such as daily, weekly, etc., sensor data is obtained by one or more sensors based on sensor scans of the building. Physical properties of the components of the building can be determined based on the sensor data. In an example, a robot with sensors that includes a LIDAR system and a video camera can roam the construction site on a weekly basis. The robot uses the LIDAR system to obtain scans of all the parts of the building and uses the video camera to obtain video images of all of the parts of the building. The sensor data from the LIDAR system is used to identify the 3D locations of the various components of the building, and the sensor data from the video camera is used to identify the colors of the various components. The sensor data can be uploaded to cloud storage.

A computer system can create a 3D representation of the building design plans, referred to herein as a "3D design view," based on the building design data captured by the various CAD applications. The computer system downloads the sensor data from cloud storage and similarly creates a 3D representation of the current state of the building, referred to herein as a "3D progress view," based on the data captured by the sensor(s). The system analyzes the 3D design view and the 3D progress view to identify the various components of the building depicted in the views, and maps the components of the 3D progress view to corresponding components of the 3D design view. The computer system can analyze the data to detect discrepancies between components of the two views. In the prior example, where a wall is installed at an incorrect location, the computer system maps the wall of the 3D progress view to a corresponding wall of the 3D design view and determines that the installed wall is not located as indicated by the design plans. The computer system determines that the installation deviates from an expected threshold and that the discrepancy is a reportable error. The computer system can send a notification of the error to the project managers.

Due to the error in the location of the wall being detected early, the error can be remedied before additional work has begun, which results in a significant reduction in the impact of the error on the schedule and costs of the construction project. By timely detecting the error, the location of the wall can be fixed before any subsequent construction involving the wall is started, resulting in avoidance of re-work of the subsequent construction. For example, by detecting the error of the location of the wall early, the wall can be fixed before any plumbing, electrical, sheetrock, etcetera work that involves the wall is started.

The disclosed technique further provides improved accuracy of construction progress status. In an example, during planning of a construction project, a schedule is developed. The schedule identifies project milestones, tasks that are to be completed for the milestone, and the date of completion of each project milestone. The computer system analyzes the schedule data and maps each milestone to a set of components of the 3D design view that are to be installed to accomplish the completion of the milestone. The computer system compares the components that have been properly installed against the list of components associated with the milestone and determines how much progress has been made towards the milestone. Where the computer system detects a deviation in installation of a component relative to a threshold, the computer system does not give credit for that component being properly installed, nor does it give credit for associated components that need to be modified or removed to address the discrepancy. As a result of detecting discrepancies in a timely fashion and not giving credit for components that have been improperly installed, the disclosed technique improves upon existing progress status evaluation techniques.

The disclosed technique additionally provides for improved accuracy construction schedule and cost estimation. In the above example, when the computer system detects the discrepancy in installation of the component, not only does the computer system not give credit for the installation of the component, the computer system also determines the approximate schedule and cost impact of addressing the discrepancy. The computer system analyzes the discrepancy and determines which components need to be removed or modified to address the discrepancy. The computer system also determines the associated schedule and cost impacts that result from the removal or modification. The computer system further analyzes the impact on subsequent tasks and provides resulting schedule and cost impacts.

In some embodiments, the disclosed technique enables earlier detection of errors or discrepancies, improved accuracy monitoring of construction progress, and improved accuracy project schedule or cost estimations. While the examples discussed above are related to construction of a building, the technique can be similarly applied to other complex structures, such as airplanes, ships, submarines, space vehicles, etc.

FIG. 1 is a system diagram illustrating an environment in which a construction monitoring system may be implemented according to some embodiments of the present disclosure. In environment 100 of FIG. 1, robot 110 is traversing a construction site. Robot 110 navigates around building 105 and other portions of the construction site in order to obtain sensor readings related to physical properties associated with the construction project. For example, robot 110 obtains sensor readings of some or all of building 105. While a robot is used in this example, any of various methods can be utilized to obtain sensor readings related to the construction project. For example, a drone that includes a sensor can be utilized to autonomously navigate around the construction site and take sensor readings. In another example, a person with a backpack that contains a sensor can walk around the construction site and take sensor readings.

In the example of FIG. 1, robot 110 traverses a path that is optimized to efficiently obtain sensor readings of all accessible portions of building 105. In some embodiments, robot 110 also traverses and obtains sensor readings of areas outside of building 105. For example, robot 110 may obtain sensor readings of landscape (to monitor development progress of landscaping), a sports facility (to monitor construction progress of, e.g., a basketball court, tennis court, pool, etc.), another building (to monitor construction progress of the other building), a parking lot or parking structure (to monitor construction progress of the parking lot or structure), etc.

As part of the construction project, a project design team, with team members such as architects, structural engineers, mechanical engineers, electrical engineers, etc., developed plans for the construction project, including design plans for the various components associated with building 105. The components can include, for example, structural beams, floors, flooring, walls, plumbing, electrical wiring, fire sprinklers, door frames and doors, external windows, internal windows, bathrooms, computer centers, surgery centers, lighting, landscaping, air conditioners, ducts, water heaters, water filtration systems, gyms, cafeterias, cabinets, closets, security systems, bulk heads, water tight doors, engines, propellers, etc. The design team sets the design of the construction project via one or more CAD applications.

Some CAD applications may inherently support 3D design capture and visualization, while others may not. Where 3D analysis is required and a CAD application does not inherently support 3D views, the CAD application can store data needed to generate a 3D view, such as elevation, depth, etc. of various components, which can be utilized to determine 3D locations of the components. Data derived from the design plan data, which can be or include the design plan data, can be stored at cloud storage 130, can be stored at storage local to the robot 110, or can be stored at other locations.

Robot 110 has access to design plan data and is able to utilize the design plan data to generate a 3D representation of building 105, and is able to navigate around building 105 by use of the 3D representation. For example, a computer, which can be physically coupled to robot 110, or can be remote, can correlate features of building 105, as determined based on sensor readings of building 105, with features of the design plans of building 105, and can use the design plans to navigate around building 105, taking into account that the construction of building 105 is only partially complete. In some embodiments, robot 110 is able to navigate around building 105 without having access to a 3D representation of building 105. For example, the boundaries of building 105 can be input to robot 110, the coordinates of a geo-fence can be transmitted to robot 110, etc., and robot 110 can use a navigation system, such as based on global position satellites (GPS) or autonomous navigation capabilities, to traverse the building 105 or of any other area related to the construction project.

Figure 2:
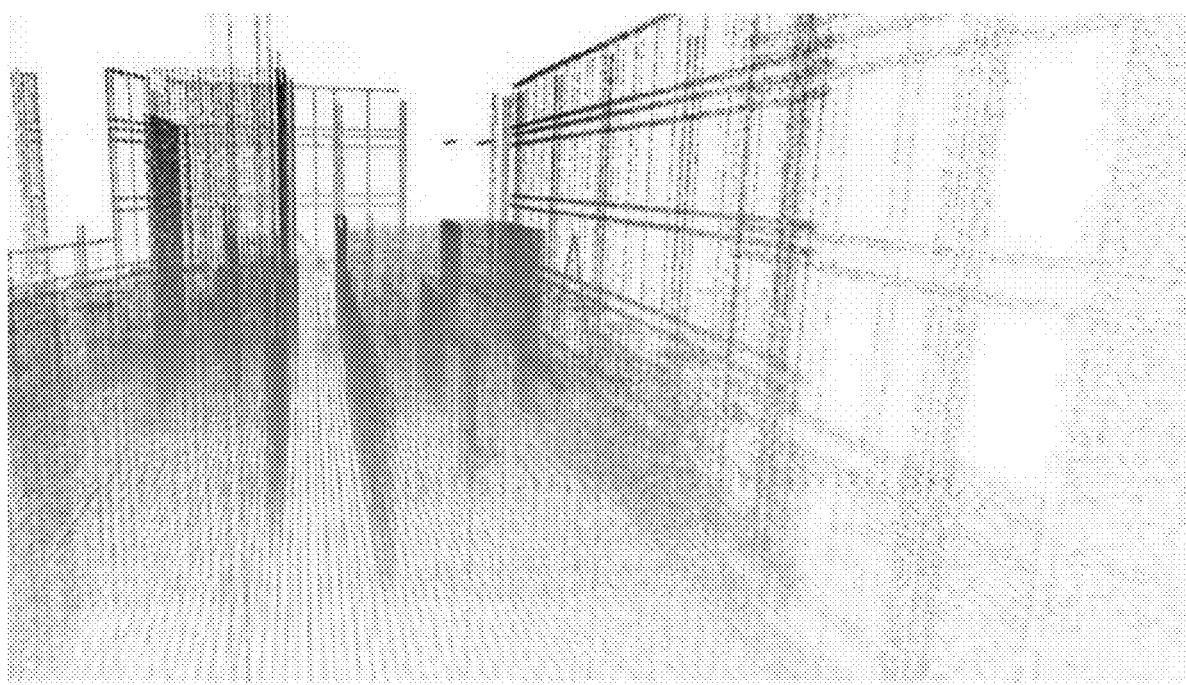
FIG. 2 is an example of a visualization of three-dimensional (3D) point cloud data obtained by a LIDAR system.

As the robot 110 traverses the construction site, robot 110 uses its sensors, such as LIDAR system 115 and imaging system 120, to obtain sensor readings. The sensor readings of LIDAR system 115 include 3D point cloud data, also referred to as 3D point data of a points cloud, from which physical properties of components related to the construction project can be derived. A portion of the 3D point cloud data includes data from which physical properties of components related to building 105, such as 3D locations of various surface points of various components of or associated with building 105, can be derived. FIG. 2 is an example of a visualization of 3D point cloud data obtained by a LIDAR system of a 3D structure undergoing construction.

The sensor readings of imaging system 120 includes imaging data, such as still picture or video data, from which physical properties of components related to the construction project can be derived. A portion of the imaging data includes data from which physical properties of components related to building 105 can be derived, such as the color or texture of surfaces of components, among others. Examples of components of building 105 include a pipe, beam, wall, floor, ceiling, toilet, roof, door, door frame, metal stud, wood stud, light fixture, piece of sheetrock, water heater, air conditioner unit, water fountain, cabinet, table, desk, refrigerator, sink, among others. Examples of components of landscaping include a tree, shrub, bench, mound, walkway, light fixture, sprinkler head, drainage fixtures, among others. Examples of physical properties of components include 3D locations of points on the surface of the component, the surface texture of the component, the 3D location of the component, the color of the component, the density or weight of the component, the reflectivity of the component, material type, unique identification of a component, unique identification of a material of a component, a flow rate, a gauge or thickness of a material of the component, among others.

In this example, robot 110 wirelessly transmits data derived from the sensor readings, which can be or include the raw sensor readings, to cloud storage 130 via network 125 for storage, where computer system 135 is able to access the stored data. Network 125 can be or can include the Internet. In some embodiments, robot 110 stores the data derived from the sensor data at storage local to robot 110, where computer system 135 is able to access the data. In some embodiments, computer system 135 is local to robot 110.

Computer system 135 accesses the data stored at cloud storage 130 or at local storage. Computer system 135 creates a 3D design view based on the design plan data and identifies the various components of the 3D design view. Computer system 135 creates a 3D progress view based on the sensor data and identifies the various components of the 3D progress view. Computer system 135 maps components of the 3D progress view to corresponding components of the 3D design view and analyzes the data to detect physical discrepancies between the two views. In some embodiments, when there is a deviation exists relative to a predetermined threshold, the discrepancy is reported as an error.

Physical discrepancies or deviations from an expected physical structure can include, for example, a 3D progress view component being located at a different location as compared to its corresponding 3D design view component, being of an different dimension as compared to its corresponding 3D design view component, being of a different color as compared to its corresponding 3D design view component, being comprised of a different material as compared to its corresponding 3D design view component, having a different surface texture as compared to its corresponding 3D design view component, being a different component as compared to its corresponding 3D design view component (e.g., being a 45-degree angle joint as compared to a 90-degree angle joint, being an a brand 1 air conditioning unit as compared to a brand 2 air conditioning unit, or being an iron pipe as compared to a copper pipe).

In some embodiments, the difference may need to be greater than a predetermined threshold to be deemed as a reportable discrepancy (e.g., a location error in excess of ⅛ of an inch). In some cases, the threshold, also sometimes referred to as accuracy tolerance, is input by the design team or by other methods as annotations on the components of the design plans. For example, a pipe may have an accuracy tolerance of ⅛ of an inch, and that tolerance may be added as an annotation on the pipe via a CAD application used to create design plan data. When the discrepancy between the location of the component in the 3D design view and the 3D progress view is greater that the accuracy tolerance, the discrepancy can be reported as an error.

Computer system 135 can detect other types of deviations. In some embodiments, the data stored at cloud storage 130 includes schedule data or other performance metrics. Computer system 135, based on the above mapping and analysis, is able to determine which components have been properly installed, which have not been installed at all or have been only partially installed, or which have been installed incorrectly. Based on this analysis, computer system 135 can detect various other types of discrepancies. For example, computer system 135 can detect a discrepancy between progress projected by a schedule or expected progress and actual progress (e.g., progress as determined based on an analysis of components of the 3D progress view, giving credit for those components that have been properly installed, and not giving credit for components that have discrepancies that need to be addressed).

As another example, computer system 135 can detect a discrepancy between a planned or targeted productivity level and an actual productivity level. In some embodiments, alerts can be being displayed for different types of discrepancies. For example, an application running on a mobile device can enable a user to set alert notification parameters, including setting an alert for a planned or targeted productivity level/score, or setting an alert for a planned progress. Based on the above analysis, mapping, and discrepancy detection, computer system 135 can provide construction progress status. For example, a mobile application or web interface can provide a milestone progress status for several groups of tasks of a building construction project.

Figure 3A:
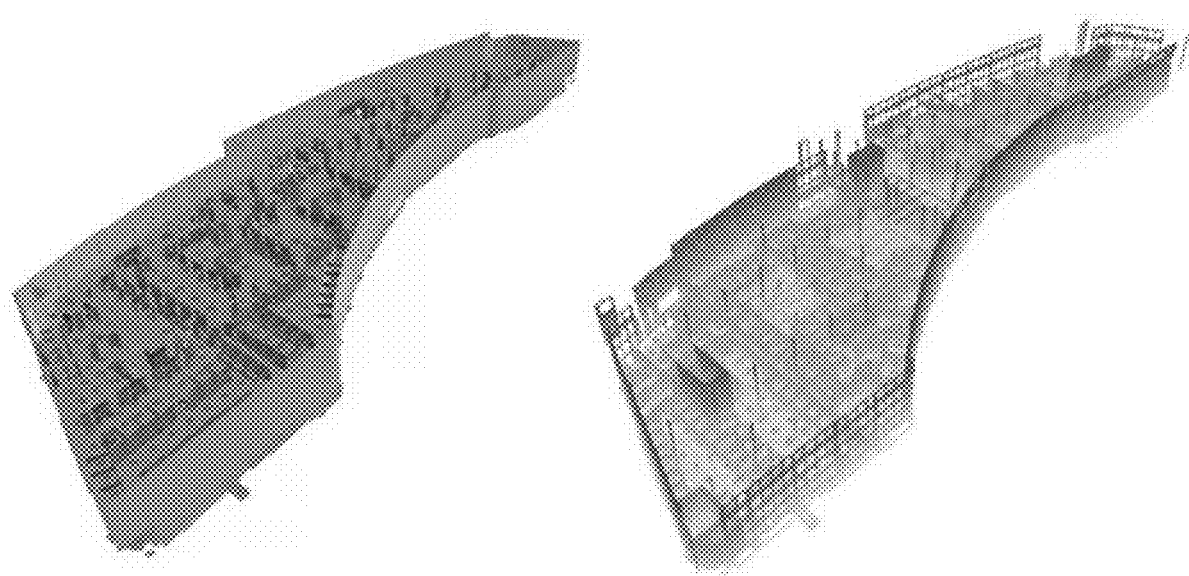
FIG. 3A depicts an image of a 3D structure undergoing construction and a computer model of the 3D structure.
Figure 3B:
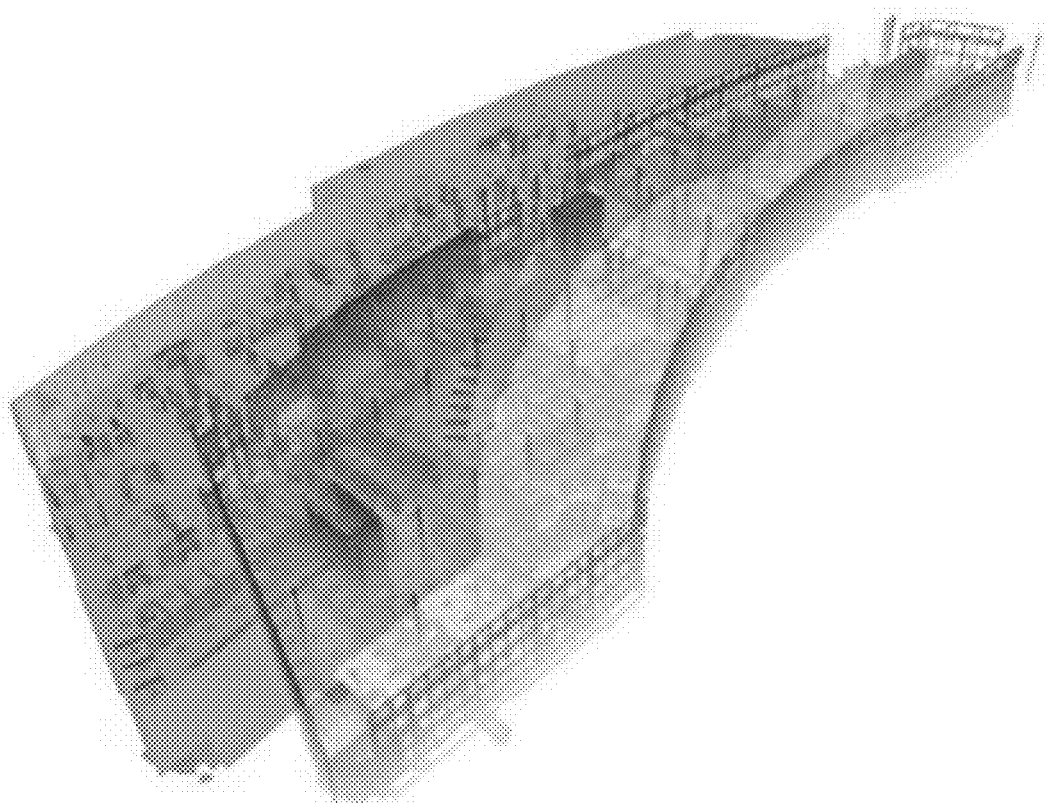
FIG. 3B depicts an alignment of a 3D structure undergoing construction with a computer model of the 3D structure.
Figure 3C:
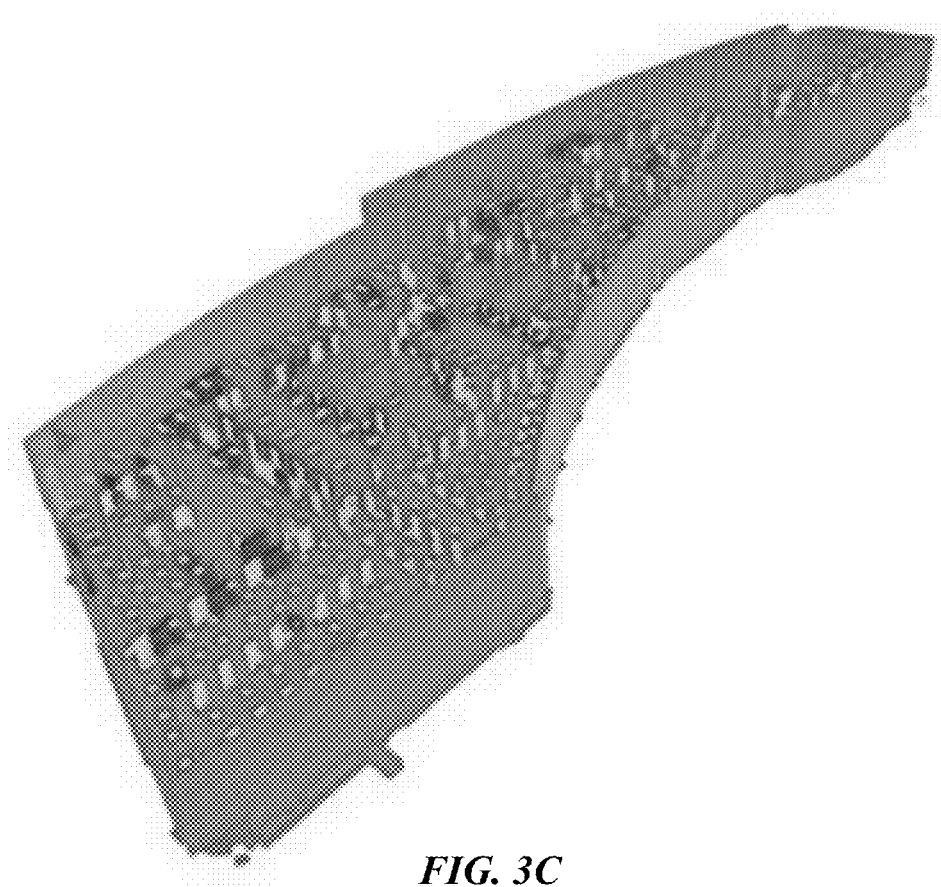
FIG. 3C depicts an image of a 3D structure undergoing construction aligned with a computer model of the 3D structure.

FIGS. 3A through 3C are illustrations that depict alignment of data derived from a model of a building, such as the reference structure, and sensor data derived from a sensor reading of a building, such as a building under construction. Specifically, FIG. 3A depicts two views, a view of a reference structure and a view of a structure under construction. FIG. 3B depicts the two views as they conceptually begin to align, and FIG. 3C shows the two views after alignment. FIGS. 3A through 3C are conceptualizations of the alignment process and may not reflect how a computer system actually aligns the views. For example, the computer system may not incrementally move the two views closer together.

FIGS. 3A through 3C reflect a common practice in the construction industry to compare the scan image of a 3D structure undergoing construction to a computer model (e.g., CAD model) that depicts the expected 3D structure. This is performed periodically with respective instances of scan images of the 3D structure that can be compared to instances of a computer model that track the progression of the ongoing construction of the 3D structure.

This allows an analyst to check that the ongoing construction of the 3D structure is closely following the instances of the computer model of the 3D structure undergoing construction, where every element of the 3D structure is represented as a geometrical shape with known 3D coordinates. As previously described, the construction industry is widely adopting a technique that involves using laser scanners and other means to scan a 3D structure that is undergoing construction. A result of the 3D scan is a data set representing points in 3D space referred to as a 3D point cloud data that forms a "points cloud."

To compare the progress of the ongoing actual construction to an expected construction of a structure, an analyst is tasked with aligning 3D point cloud data of the structure with a computer model that depicts the expected 3D structure undergoing construction. Specifically, a coordinate frame of a scan image of a 3D structure undergoing construction must be aligned with a coordinate frame of a computer model that depicts the expected 3D structure at the point in time when the 3D structure is undergoing construction.

An alignment procedure typically involves positioning crosshair reference marks at different locations of an ongoing construction of a structure. Accordingly, a scan image of the 3D structure includes embedded images of the crosshair reference marks. An analyst must them manually locate the crosshair marks in the 3D point cloud data derived from the scan image. The analyst selects each crosshair individually and establishes a correspondence with a crosshair mark in the computer model of the expected 3D structure. In other words, the analyst must manually map the crosshair marks obtained from the scan image of the ongoing construction to corresponding crosshair marks in the computer model. Therefore, the alignment process is laborious, time-consuming, and a costly process that results in delays (e.g., days, weeks) before data about a scan image is even ready to compare against an expected representation in the computer model.

To track the progress of an ongoing construction until it is brought to completion, the process of aligning a 3D point cloud data and an instance of a computer model must be repeated periodically. For example, a scan image can be obtained periodically and compared to a corresponding computer model of the same coordinate frame at an expected point in time of the ongoing construction.

Accordingly, the process of mapping 3D point cloud data to an instance of a computer model is periodic at successive points in time. Consequently, the benefits of ensuring that an ongoing construction of a 3D structure does not deviate from its expected 3D model is vastly outweighed by construction delays and costs that result from periodically repeating the laborious, time-consuming, and costly alignment process before even analyzing the differences between the actual and expected representations. That is, any savings that result from avoiding the need to re-work a construction is negated by the costs that result from delays in construction to prepare and perform the deviation analysis. Consequently, the manual mapping process is cost-prohibitive and unsuitable for repetitive low-latency data capture for deviation analysis.

Figure 4:
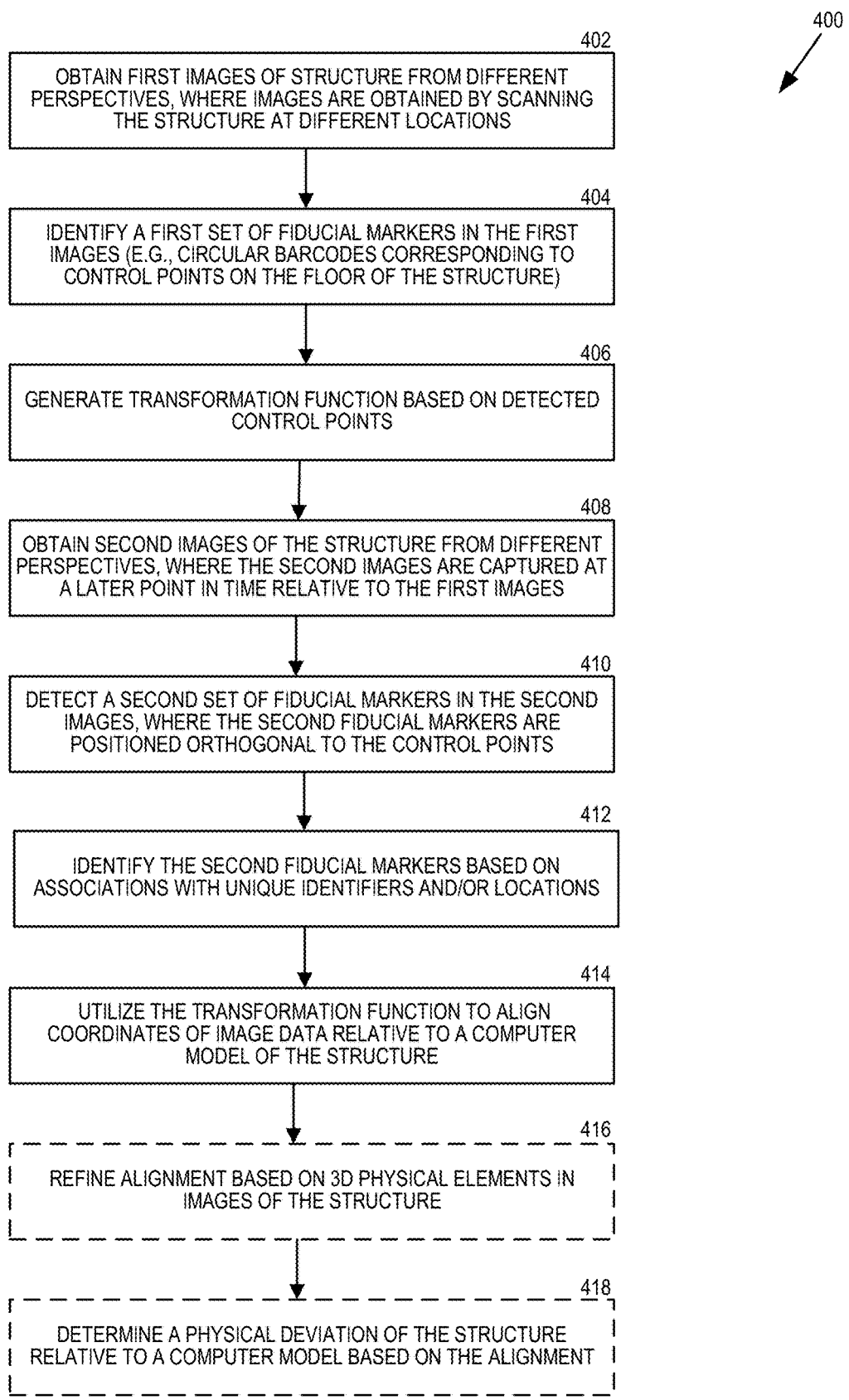
FIG. 4 is a flowchart that illustrates a process for utilizing fiducial markers to automate repetitive alignments of scanned images of a structure with a computer model of that structure.

FIG. 4 is a flowchart that illustrates a process for automating alignment of image data captured of a 3D physical structure with a computer model (e.g., CAD model) of the 3D physical structure. The process 400 can be performed by a tracking system that can track construction of a structure over time relative to expected states of the construction as represented by the computer model. For example, the tracking system can include a robotic unmanned vehicle equipped with a LIDAR device to capture images by traversing a construction. Hence, the structure progressively changes over time until the construction is complete.

The disclosed embodiments improve over prior systems by using fiducial markers to automate repetitive aspects of the alignment process. In some embodiments, an initial alignment with a computer model is performed by capturing multiple images of a construction site with fiducial markers. The initial alignment is performed automatically and enables performing subsequent repetitive iterative alignments based on images captured over subsequent points in time as the construction progresses. In some embodiments, however, the initial alignment is performed manually to enable subsequent automatic and repetitive alignments.

The first alignment of the 3D coordinates of the fiducial markers can be recorded in a database, where each fiducial marker has a unique identifier and unique 3D position. The sequential instances of 3D point cloud data can be maintained as separate files that are associated with different points in time such that various instances track the progression of the construction. The separate instances of 3D point cloud data can be registered with respect to each other, thereby maintaining a consistent coordinate system. In other words, the various instances can be normalized so that they share the same coordinate system.

In some embodiments, the initial alignment is performed using machine learning techniques that can involve using training data sets to intelligently align the initial fiducial markers to an initial computer model. For example, artificial intelligence techniques can utilize prior data about fiducial markers and their relationships in ongoing constructions. In some instances, a kit for performing a deviation analysis of an ongoing construction may include a sequence of fiducial markers that are pre-identified as "kitchen, rear wall—first instance" and "kitchen, entrance wall—second instance," etc. As such, an individual is guided to position the fiducial markers as identified to facilitate automating alignment of 3D points cloud data to instances of a computer model.

Figure 5A:
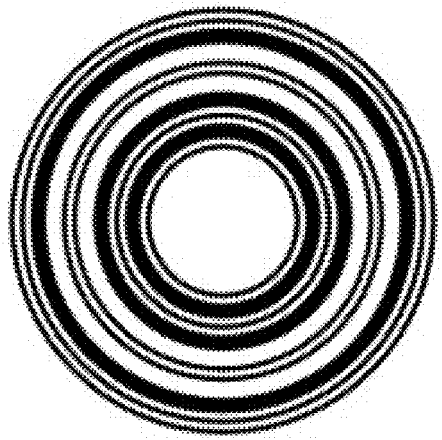
FIG. 5A depicts an example of a circular fiducial marker.
Figure 5B:
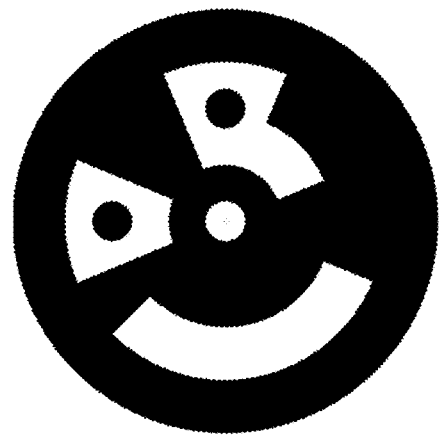
FIG. 5B depicts another example of a circular fiducial marker.
Figure 5C:
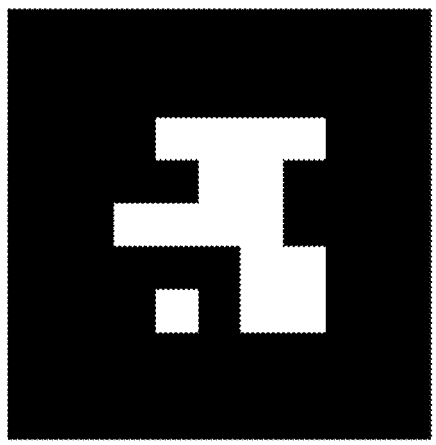
FIG. 5C depicts an example of a rectangular fiducial marker.
Figure 5D:
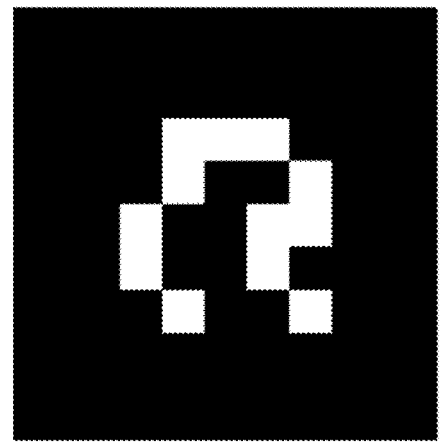
FIG. 5D depicts another example of a rectangular fiducial marker.

FIGS. 5A through 5D depict examples of fiducial markers. Specifically, FIGS. 5A and 5B depict examples of circular fiducial markers and FIGS. 5C and 5D depict examples of rectangular fiducial markers. As shown, a fiducial marker is a 2D barcode that is unique relative to every fiducial marker. A fiducial marker can have a unique grayscale or binary pattern on a planar surface. A fiducial marker is associated with data that is derivable from an image of the fiducial marker. For example, the data associated with a fiducial marker can include a description of a physical element upon which the fiducial marker is affixed. Other data can include a location of the fiducial marker, a unique numerical indicator, and/or a point in time. The data associated with a fiducial marker can remain consistent throughout the construction of the 3D physical structure. In some embodiments, a set or all fiducial markers are identical but the association of a fiducial marker with an image, location, and/or object is unique. As such, each of the fiducial markers are distinctly different because of their unique associations.

Figure 6A:
FIG. 6A is a two-dimensional (2D) grayscale image including fiducial markers positioned on a floor of a scanned 3D structure.

In step 402, the tracking system can capture a first set of images of the 3D physical structure undergoing construction. For example, FIG. 6A is a 2D grayscale image 600-1 including fiducial markers 602-1, 602-2, and 602-3 positioned at different locations on the floor of a structure undergoing construction. The 2D image is in grayscale and can be computed using intensity or color information. The grayscale image can be generated with algorithms that are well known to persons skilled in the art. The fiducial markers are positioned such that 3D scans of the structure include images of those markers embedded in the images. As shown, the fiducial markers 602-1, 602-2, and 602-3 are circular barcodes that have associations with an image, location, and/or object is unique. In the illustrated example, each fiducial marker has a binary black and white pattern printed on a planar surface.

An image is a scan of the structure that can be obtained with, for example, a LIDAR system and camera mounted on a robot. The initial scan of the structure is performed at a point in time to obtain a first instance of 3D point cloud data that includes fiducial markers. The 3D scan for each instance can be taken from a static location and could be represented as a spherical 2D image, where any pixel value is a vector in a 3D coordinate frame, has a laser intensity value and, optionally, a color.

Figure 6B:
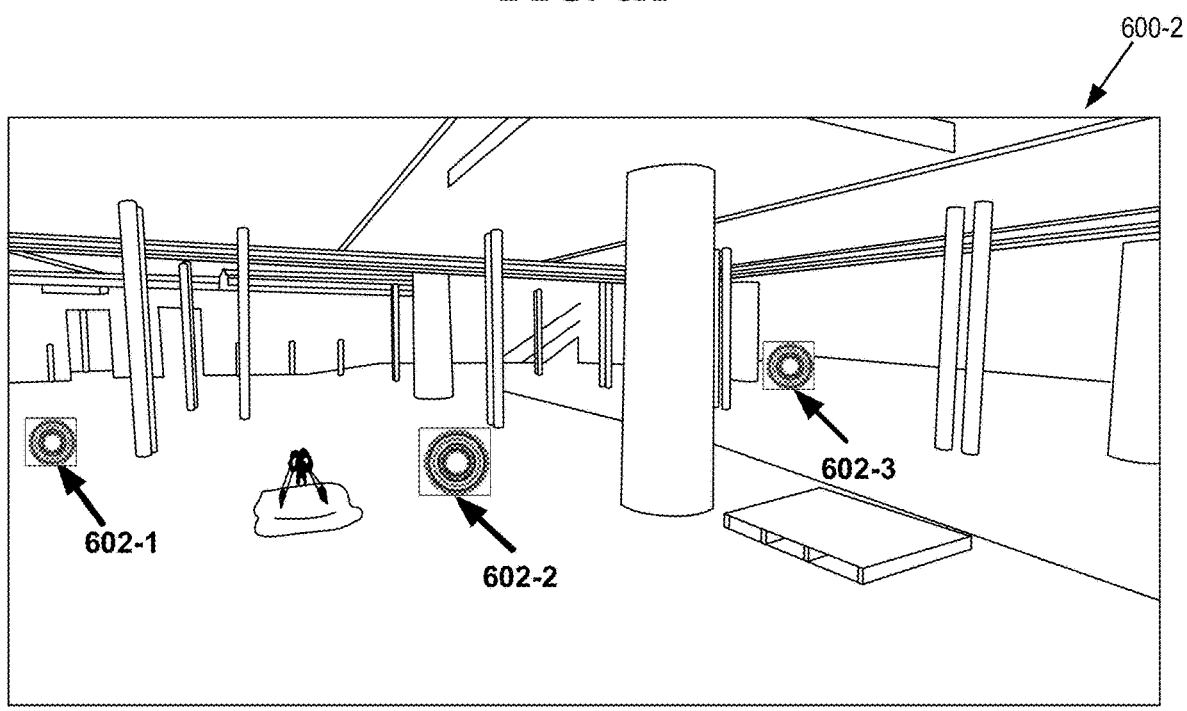
FIG. 6B is a binary representation of the 2D image of FIG. 6A, which identifies the fiducial markers.

In step 404, the tracking system identifies the fiducial markers appearing in the first set of captured images. For example, the transformation of a 3D scan into the 2D grayscale image 600-1 facilitates detection of the fiducial markers 602-1, 602-2, and 602- by using methods known in the field of augmented reality for localizing markers. FIG. 6B is a binary black and white representation of the image of FIG. 6A with the fiducial markers clearly identified in the image 600-2.

Thus, the fiducial markers are suitable for detection in grayscale or binary images. The fiducial markers can have redundant properties to aid in error correction. For example, all the fiducial markers could have the same frame size and be required for placement only on certain surfaces or in certain orientations. As such, the consistent features can help differentiate the fiducial markers from random visual clutter in images. Hence, possible fiducial markers can be validated if they have an expected physical size and are in an expected oriented. The combination of fiducial markers may be critical to avoid errors caused by misplaced fiducial markers. For example, avoiding any duplicate fiducial markers can facilitate tracking the progress of a construction site.

Specifically, the fiducial markers are either unique among each other or are associated with a unique relationship such that each fiducial marker can be uniquely identified from any other fiducial marker. As a result, each fiducial marker can be associated with unique data that can be used to identify the fiducial marker in an image of the structure. For example, a fiducial marker can be unique relative to any other fiducial marker used throughout the entire construction of the structure. Further, each fiducial marker can be associated with data that can be derived based on the uniqueness of the fiducial marker. For example, each fiducial marker may be associated with information indicative of a location of the fiducial marker and a unique numerical indicator.

In some embodiments, each fiducial marker is associated with unique data after the fiducial markers have been positioned on the structure undergoing construction. For example, a fiducial marker posted on a wall of a kitchen of a construction site may be associated with the term "kitchen, rear wall" and a unique numerical value after a scan has been taken of the kitchen. Another fiducial marker posted on another wall of the kitchen may be associated with the term "kitchen, entrance wall" and another unique numerical value. The two fiducial markers are associated with data that is unique for tracking the construction of the structure. In addition, a point in time of an ongoing construction is impliedly associated with each and every fiducial marker.

In step 406, the tracking system generates a transformation function based on the identified fiducial markers in the first set of images. The transformation function maps the detected fiducial markers to control points in the computer model. As such, the transformation function maps presumed control points in an initial set of scanned images to the known control points in the computer model. More generally, a transformation is a function f that maps a set X to itself (e.g., f: X→X), or from set X to another set Y. Examples include linear transformations and affine transformations, rotations, reflections, and translations. These can be carried out in Euclidean space, particularly in two-dimensions and three-dimensions). They are also operations that can be performed using linear algebra and described explicitly using matrices. The concepts underlying transformations are well known to persons skilled in the art and, as such, are not described herein in detail for the sake of brevity.

Figure 7A:
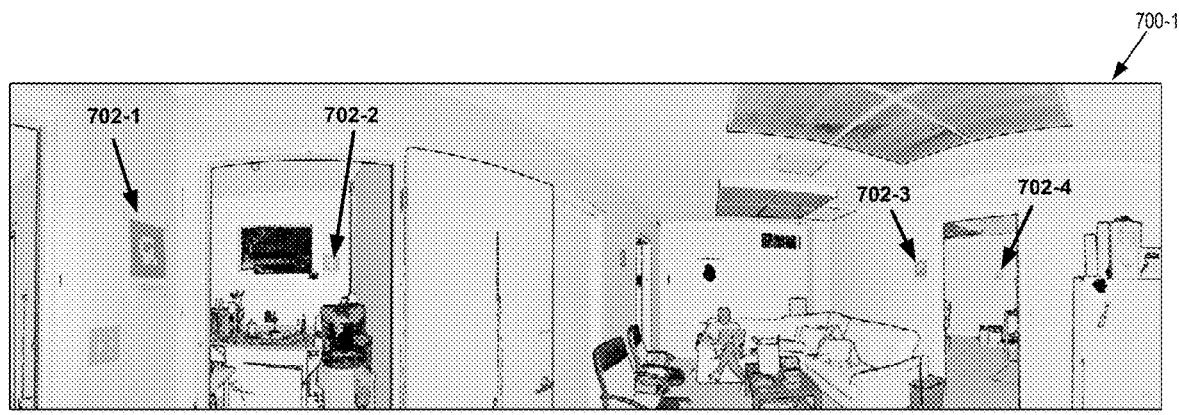
FIG. 7A is a 2D grayscale image including fiducial markers positioned on walls of a scanned 3D structure.

In step 408, the tracking system obtains a second set of images of the 3D physical structure undergoing construction. The second set of fiducial markers positioned on the 3D physical structure are detected from images captured from different perspectives of the 3D physical structure. The grayscale images include binary images of the fiducial markers. FIG. 7A is an example of a 2D grayscale image including fiducial markers 702-1, 702-2, 702-3, and 702-4 that are positioned on walls of a scanned 3D structure. A representation of the 3D physical structure is generated by scanning the 3D physical structure with an imaging device to convert a spherical 2D image of the 3D physical structure into a grayscale or binary image to identify any fiducial markers appearing on vertical surfaces of the 3D physical structure.

In step 410, the tracking system detects a second set of fiducial markers in the second set of images. In this instance, each fiducial marker is unique among the set of fiducial markers. The fiducial markers in the spherical 2D images are detected as 2D barcodes that are unique relative to each other. The binary nature and positioning of the fiducial markers on planer surfaces facilitates detecting the fiducial markers in the scan images. In some embodiments, the positions of fiducial markers are calculated by using transformations obtained via prior fiducial markers known relative to the ongoing construction.

Figure 7B:
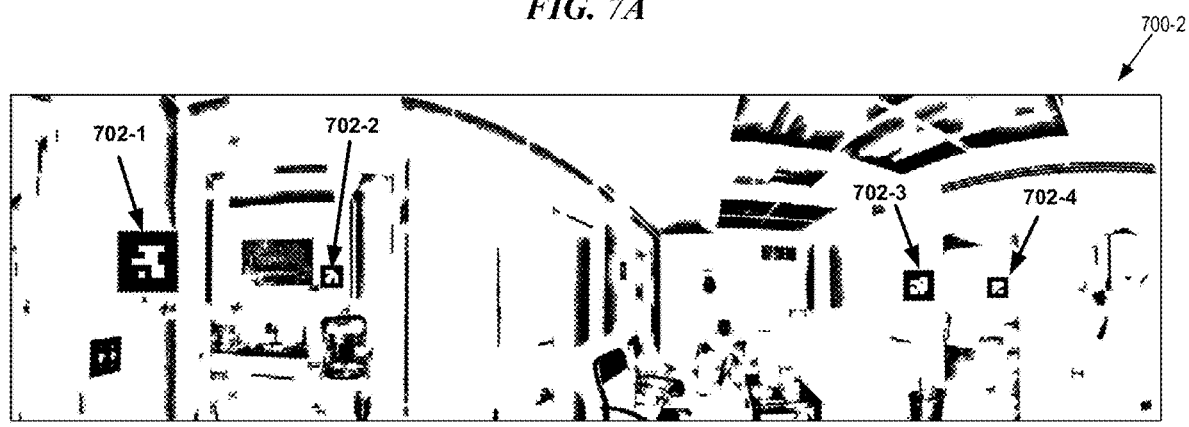
FIG. 7B is a binary representation of the 2D image of FIG. 7A including the fiducial markers.

FIG. 7B is a binary representation of the 2D image of FIG. 7A that identifies the fiducial markers in FIG. 7B. FIG. 7B is an example of a spherical 3D image that was transformed into a binary image to readily detect and identify the fiducial positioned on the different walls of the structure. Specifically, each fiducial marker can be associated with a data pair including an identifier and a location in a scan coordinate frame. The data pair for each fiducial marker is stored in a database (e.g., registered). The data pair for each fiducial marker can be compared to data pairs of prior fiducial markers stored in the database to establish correspondences and calculate a rigid transformation (i.e., rotation and translation) from the scan to the real-world coordinate frame. As such, a fiducial marker that is registered to a kitchen island can be identified relative to other registered or detected fiducial markers. Any 3D point cloud data obtained after the initial 3D point cloud data can include new fiducial markers that can be related back to prior instances of 3D point cloud data.

In some embodiments, detecting the fiducial marker involves determining a location of the fiducial marker by performing a transformation relative to a known feature of the 3D physical structure. A corresponding pixel from the scan image is taken and a spatial coordinate system of that pixel is determined as a 3D fiducial marker location. In some embodiments, each fiducial marker has a consistent frame size, encodes a unique numeric identifier, and has a redundant physical property. As such, detecting the fiducial marker comprises comparing the redundant physical property to a reference property to distinguish the fiducial marker from noise in the plurality of 2D images. For example, the tracking system can identify an erroneously detected fiducial marker based on the size or vertical orientation of an image detected as a fiducial marker.

Unlike the first set of fiducial markers that are meant to establish control points for subsequent alignments, the second set of fiducial markers are meant to track the construction of the structure. In some embodiments, the second set of fiducial markers is oriented orthogonal to the first set of fiducial markers. In some embodiments, each of the first set of fiducial markers has a first geometric shape (e.g., circle) and each of the second set of fiducial markers has a second geometric shape (e.g., rectangle) different from the first geometric shape. In some embodiments, the fiducial markers are positioned such that images of the construction site includes an image of each fiducial marker.

In step 412, the fiducial markers on the walls of the construction site are identified (e.g., relative to registered fiducial markers) in association with a unique identifier and a unique location relative to the 3D physical structure. That is, the fiducial markers in the spherical 2D image are identified as 2D barcodes that are unique relative to each other. The binary nature and positioning of the fiducial markers on planer surfaces facilitates detecting the fiducial markers in the scan image. In some embodiments, the positions of fiducial markers are calculated by using transformations obtained via the initial fiducial markers (i.e., control points) known relative to the ongoing construction. By knowing the location of a fiducial marker in the grayscale image, the corresponding pixel from the scan image is taken and a 3D coordinate of that pixel is determined as a 3D fiducial marker location.

In step 414, image data of the second plurality of fiducial markers is aligned to an instance of the computer model by utilizing the transformation function, where the instance of the computer model represents an expected state of the 3D physical structure at a point in time. In some embodiments, multiple instances of the 3D point cloud data are mapped to a computer model of the structure, which depicts the expected construction at different points in time when each 3D scan was captured. The mapping involves an alignment of a coordinate frame of the 3D point cloud data to the computer model. In some embodiments, machine learning techniques are used to align a coordinate system of fiducial markers to a coordinate system of the computer model.

In step 416, the alignment is optionally refined by utilizing a refinement transformation based on physical elements of the structure in scanned images. For example, FIG. 8A depicts an image of a 3D physical element in a 3D physical structure used to refine an alignment of the 3D physical structure. FIG. 8B depicts another image of a 3D physical element in the 3D physical structure used to refine an alignment of the 3D physical structure. FIGS. 8A and 8B depict misalignments of the physical elements, which can be used to generate a refinement transformation to adjust the global alignment of the physical structure to the computer model. Hence, the refinement transformation can be generated in a manner similar to that described with respect to step 406, at an element-level to refine the alignment globally. For example, the refinement transformation considers an appearance of the physical elements in scanned images to an expected state of the physical elements in the computer model.

In step 418, a physical deviation of the structure relative to a computer model is optionally determined based on the alignment data. Any subsequent instance of a deviation analysis that is performed of the ongoing construction can benefit from the utilization of sequential fiducial markers. Thus, embodiments build off the initial set of fiducial markers to track the progress of a construction and track any deviations.

At least some steps illustrated in FIG. 4 can be performed iteratively as construction progresses (e.g., structurally, over time). As the construction progresses, new fiducial markers are added to consider new walls and deal with the occlusion of existing markers. For example, registered fiducial markers could be hid behind newly erected walls. The locations may include structures that currently have other fiducial markers or new locations that have been constructed since the last alignment. For example, a new fiducial marker can be posted on a kitchen island that was constructed since the last alignment instance.

Thus, as a result of the automated repetitive alignments, any differences between the actual structure being constructed and the expected structure can be quickly determined to track the progress of the construction. The differences between an actual and expected structure can then be used to determine any variance that could subsequently impact the cost of the construction project as well as the integrity of the structure. Therefore, the disclosed embodiments can use fiducial markers in an augmented reality context to automate scan and model alignment to provide much faster deviation analysis with minimal or no manual setup. However, the automatic alignment process is not strictly for performing a deviation analysis and could be utilized for various other purposes.

Figure 9:
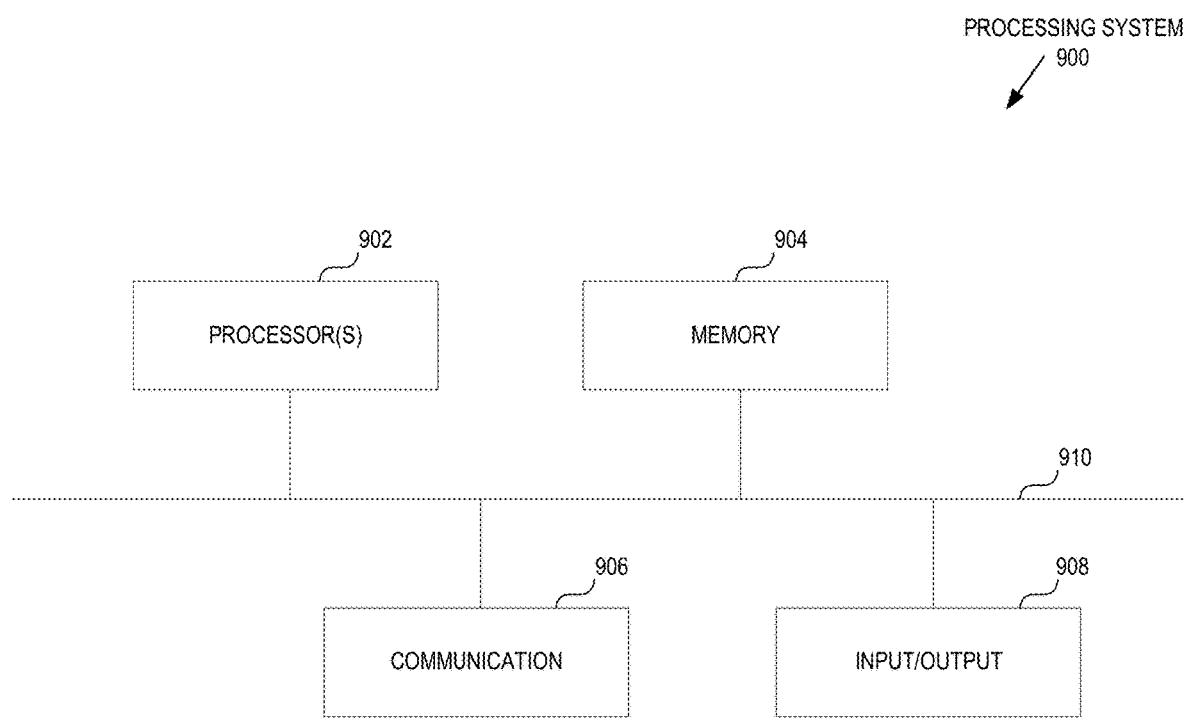
FIG. 9 is a block diagram that illustrates an example of a processing system in which at least some operations described herein can be implemented.

FIG. 9 is a block diagram illustrating an example of a processing system in which at least some operations described herein can be implemented. The processing system can be processing system 900, which represents a system that can run any of the methods/algorithms described above. For example, processing system 900 can be computer system 135, or can be a processing device included in robot 110, LIDAR 115, or imaging system 120, among others. A system may include two or more processing devices such as represented in FIG. 9, which may be coupled to each other via a network or multiple networks. A network can be referred to as a communication network.

In the illustrated embodiment, the processing system 900 includes one or more processors 902, memory 904, a communication device 906, and one or more input/output (I/O) devices 908, all coupled to each other through an interconnect 910. The interconnect 910 may be or include one or more conductive traces, buses, point-to-point connections, controllers, adapters and/or other conventional connection devices. Each of the processors 902 may be or include, for example, one or more general-purpose programmable microprocessors or microprocessor cores, microcontrollers, application specific integrated circuits (ASICs), programmable gate arrays, or the like, or a combination of such devices. The processor(s) 902 control the overall operation of the processing system 900. Memory 904 may be or include one or more physical storage devices, which may be in the form of random access memory (RAM), read-only memory (ROM) (which may be erasable and programmable), flash memory, miniature hard disk drive, or other suitable type of storage device, or a combination of such devices. Memory 904 may store data and instructions that configure the processor(s) 902 to execute operations in accordance with the techniques described above. The communication device 906 may be or include, for example, an Ethernet adapter, cable modem, Wi-Fi adapter, cellular transceiver, Bluetooth transceiver, or the like, or a combination thereof. Depending on the specific nature and purpose of the processing system 900, the I/O devices 908 can include devices such as a display (which may be a touch screen display), audio speaker, keyboard, mouse or other pointing device, microphone, camera, etc.

While processes or blocks are presented in a given order, alternative embodiments may perform routines having steps, or employ systems having blocks, in a different order, and some processes or blocks may be deleted, moved, added, subdivided, combined, and/or modified to provide alternative or sub-combinations, or may be replicated (e.g., performed multiple times). Each of these processes or blocks may be implemented in a variety of different ways. In addition, while processes or blocks are at times shown as being performed in series, these processes or blocks may instead be performed in parallel, or may be performed at different times. When a process or step is "based on" a value or a computation, the process or step should be interpreted as based at least on that value or that computation.

Software or firmware to implement the techniques introduced here may be stored on a machine-readable storage medium and may be executed by one or more general-purpose or special-purpose programmable microprocessors. A "machine-readable medium", as the term is used herein, includes any mechanism that can store information in a form accessible by a machine (a machine may be, for example, a computer, network device, cellular phone, personal digital assistant (PDA), manufacturing tool, any device with one or more processors, etc.). For example, a machine-accessible medium includes recordable/non-recordable media (e.g., read-only memory (ROM), random access memory (RAM), magnetic disk storage media, optical storage media, flash memory devices), etc.

Note that any and all of the embodiments described above can be combined with each other, except to the extent that it may be stated otherwise above or to the extent that any such embodiments might be mutually exclusive in function and/or structure.

Although the present invention has been described with reference to specific exemplary embodiments, it will be recognized that the invention is not limited to the embodiments described but can be practiced with modification and alteration within the spirit and scope of the disclosed embodiments. Accordingly, the specification and drawings are to be regarded in an illustrative sense rather than a restrictive sense.

Physical and functional components (e.g., devices, engines, modules, and data repositories) associated with processing system 900 can be implemented as circuitry, firmware, software, other executable instructions, or any combination thereof. For example, the functional components can be implemented in the form of special-purpose circuitry, in the form of one or more appropriately programmed processors, a single board chip, a field programmable gate array, a general-purpose computing device configured by executable instructions, a virtual machine configured by executable instructions, a cloud computing environment configured by executable instructions, or any combination thereof. For example, the functional components described can be implemented as instructions on a tangible storage memory capable of being executed by a processor or other integrated circuit chip. The tangible storage memory can be computer readable data storage. The tangible storage memory may be volatile or non-volatile memory. In some embodiments, the volatile memory may be considered "non-transitory" in the sense that it is not a transitory signal. Memory space and storages described in the figures can be implemented with the tangible storage memory as well, including volatile or non-volatile memory.

Each of the functional components may operate individually and independently of other functional components. Some or all of the functional components may be executed on the same host device or on separate devices. The separate devices can be coupled through one or more communication channels (e.g., wireless or wired channel) to coordinate their operations. Some or all of the functional components may be combined as one component. A single functional component may be divided into sub-components, each sub-component performing separate method step or method steps of the single component.

In some embodiments, at least some of the functional components share access to a memory space. For example, one functional component may access data accessed by or transformed by another functional component. The functional components may be considered "coupled" to one another if they share a physical connection or a virtual connection, directly or indirectly, allowing data accessed or modified by one functional component to be accessed in another functional component. In some embodiments, at least some of the functional components can be upgraded or modified remotely (e.g., by reconfiguring executable instructions that implements a portion of the functional components). Other arrays, systems and devices described above may include additional, fewer, or different functional components for various applications.

Aspects of the disclosed embodiments may be described in terms of algorithms and symbolic representations of operations on data bits stored in memory. These algorithmic descriptions and symbolic representations generally include a sequence of operations leading to a desired result. The operations require physical manipulations of physical quantities. Usually, though not necessarily, these quantities take the form of electric or magnetic signals that are capable of being stored, transferred, combined, compared, and otherwise manipulated. Customarily, and for convenience, these signals are referred to as bits, values, elements, symbols, characters, terms, numbers, or the like. These and similar terms are associated with physical quantities and are merely convenient labels applied to these quantities.

While embodiments have been described in the context of fully functioning computers, those skilled in the art will appreciate that the various embodiments are capable of being distributed as a program product in a variety of forms and that the disclosure applies equally, regardless of the particular type of machine or computer-readable media used to actually effect the embodiments.

The invention claimed is:

1. A method for automating alignment of image data captured of a three-dimensional (3D) physical structure with a computer model of the 3D physical structure, the method comprising:
  obtaining a first plurality of two-dimensional (2D) images of the 3D physical structure undergoing construction;
  detecting a first plurality of fiducial markers appearing in the first plurality of 2D images, each of the first plurality of fiducial markers being unique among the first plurality of fiducial markers;
  based on the first plurality of fiducial markers, determining a transformation function to map the first plurality of fiducial markers to a plurality of control points in the computer model;

obtaining a second plurality of 2D images of the 3D physical structure undergoing construction;

detecting a second plurality of fiducial markers appearing in the second plurality of 2D images, each of the second plurality of fiducial markers being unique among the second plurality of fiducial markers;

identifying each of the second plurality of fiducial markers in association with a unique identifier and a unique location relative to the 3D physical structure;

aligning image data of the second plurality of fiducial markers to an instance of the computer model by utilizing the transformation function, the instance of the computer model representing an expected state of the 3D physical structure at a point in time; and refining an alignment by utilizing a refinement transformation based on a plurality of 3D physical elements of the 3D physical structure in the second plurality of 2D images, the refinement transformation comparing an appearance of the 3D physical elements in the second plurality of 2D images to an expected state of the 3D physical elements.

2. The method of claim 1 further comprising:
determining a difference between a current state of the 3D physical structure relative to the expected state of the 3D physical structure.

3. The method of claim 1, wherein each of the first plurality of fiducial markers is oriented orthogonal to the second plurality of fiducial markers.

4. The method of claim 1, wherein each of the first plurality of fiducial markers has a first geometric shape and each of the second plurality of fiducial markers has a second geometric shape different from the first geometric shape.

5. The method of claim 1 further comprising:
generating 3D point cloud data of the 3D physical structure based on the second plurality of fiducial markers detected in the second plurality of 2D images and additional 2D images captured at subsequent points in time as construction of the 3D physical structure progresses towards completion; and performing the alignment of the 3D point cloud data to the computer model at the subsequent points in time, wherein a subsequent alignment utilizes data from a prior alignment.

6. The method of claim 1, wherein the image data includes a spatial coordinate system.

7. A system configured to track construction of a three-dimensional (3D) physical structure, the system comprising:
one or more processor; and
one or more memories including instructions executable by the processors causing the system to:
obtain a plurality of two-dimensional (2D) images of a 3D physical structure undergoing construction;
detect a plurality of fiducial markers appearing in the plurality of 2D images, each of the plurality of fiducial markers being unique among the plurality of fiducial markers;
identify each of the plurality of fiducial markers in association with a unique identifier and a unique location relative to the 3D physical structure; and
align image data of the plurality of 2D images to an instance of a computer model representing an expected state of the 3D physical structure.

8. The system of claim 7, further caused to:
refine the alignment based on a plurality of 3D physical elements of the 3D physical structure appearing in the plurality of 2D images.

9. The system of claim 7 further caused to:
identify an erroneously detected fiducial marker based on the size or vertical orientation of an image detected as a fiducial marker.

10. The system of claim 7, further comprising:
a robotic unmanned vehicle including a light detection and ranging (LIDAR) system of an imaging device, wherein the robotic unmanned vehicle is configured to traverse the 3D physical structure to capture the plurality of 2D images.

11. The system of claim 7, wherein the plurality of fiducial markers is positioned such that a plurality of 2D images of the 3D physical structure includes an image of each fiducial marker.

12. The system of claim 7, wherein each fiducial marker is positioned on a surface of a physical element of the 3D physical structure.

13. The system of claim 4 wherein each fiducial marker is a two-dimensional (2D) barcode that is unique relative to every fiducial marker.

14. The system of claim 7, wherein each fiducial marker has a unique grayscale or binary pattern on a planar surface.

15. A non-transitory computer-readable storage medium that stores instructions to be executed by at least one processor, wherein the instructions cause a computer system to perform a method for tracking construction of a three-dimensional (3D) physical structure, the method comprising:
obtaining a plurality of two-dimensional (2D) images of a 3D physical structure undergoing construction;
detecting a plurality of fiducial markers appearing in the plurality of 2D images, each of the plurality of fiducial markers being unique among the plurality of fiducial markers;
identifying each of the plurality of fiducial markers in association with a unique identifier and a unique location relative to the 3D physical structure; and
aligning image data of the plurality of 2D images to an instance of a computer model representing an expected state of the 3D physical structure.

16. The non-transitory computer-readable storage medium of claim 15, wherein the method further comprises, prior to obtaining the plurality of 2D images:
determining a transformation function that maps a plurality of control point markers on the 3D physical structure with the computer model to map a coordinate system of the plurality of 2D images to a coordinate system of the computer model.

17. The non-transitory computer-readable storage medium of claim 15, wherein the method further comprises:
refining the alignment based on a plurality of 3D physical elements of the 3D physical structure appearing in the plurality of 2D images.

18. The non-transitory computer-readable storage medium of claim 15, wherein each fiducial marker has a consistent frame size, encodes a unique numeric identifier, and has a redundant physical property, and detecting the fiducial marker comprises:
comparing the redundant physical property to a reference property to distinguish the fiducial marker from noise in the plurality of 2D images.

19. The non-transitory computer-readable storage medium of claim 15, wherein the method further comprises:
identifying an erroneously detected fiducial marker based on the size or vertical orientation of an image detected as a fiducial marker.

20. The non-transitory computer-readable storage medium of claim 15, wherein each fiducial marker is associated with data that is derivable from an image of the fiducial marker, the data including an indication of a location of the fiducial marker, a unique numerical indicator, and a point in time that remains consistent throughout construction of the 3D physical structure.

21. The non-transitory computer-readable storage medium of claim 15, wherein a fiducial marker is associated with a description of a physical element upon which the fiducial marker is positioned.

22. The non-transitory computer-readable storage medium of claim 15, wherein identifying the detected fiducial marker comprises:
computing image information about the fiducial marker by using intensity or color information.

23. The non-transitory computer-readable storage medium of claim 15, wherein the plurality of fiducial markers positioned on the 3D physical structure are detected from a plurality of images captured from different perspectives of the 3D physical structure.

24. The non-transitory computer-readable storage medium of claim 15, wherein any fiducial marker is a binary two-dimensional (2D) image in a grayscale 2D image of the 3D physical structure.

25. The non-transitory computer-readable storage medium of claim 15, wherein each of the plurality of 2D images is a grayscale image including a binary image of any fiducial marker, and detecting the fiducial marker comprises:
determining a location of any fiducial marker by performing a transformation relative to a known feature of the 3D physical structure,
wherein a corresponding pixel from a scan image is taken and a spatial coordinate system of that pixel is determined as a 3D fiducial marker location.

26. The non-transitory computer-readable storage medium of claim 15, wherein generating a representation of the 3D physical structure by scanning the 3D physical structure with an imaging device comprises:
converting a spherical two-dimensional (2D) image of the 3D physical structure into a binary image to detect and identify any fiducial markers appearing on vertical surfaces of the 3D physical structure.

27. The non-transitory computer-readable storage medium of claim 15, wherein aligning the image data of the 3D physical structure comprises:
associating each fiducial marker with a data pair including an identifier and a location in a spatial coordinate frame;
storing each data pair in a memory; and
comparing each data pair to another data pair stored in the memory to perform a transformation to a real-world coordinate frame.

28. The non-transitory computer-readable storage medium of claim 15, wherein an initial alignment to the computer model is performed manually.

29. The non-transitory computer-readable storage medium of claim 15, wherein aligning the image data of the 3D physical structure comprises:
recording a coordinate system of the plurality of fiducial markers in a memory; and
normalizing any subsequent alignment to the computer model by the coordinate system.

30. A system for utilizing fiducial markers to automatically align scanned images of a physical structure with a computer model of the physical structure, the system comprising:
means for obtaining a plurality of spherical two-dimensional (2D) images of a partially completed construction of the physical structure by scanning the physical structure from a plurality of perspectives;
means for detecting a plurality of fiducial markers appearing in the plurality of spherical 2D images, wherein each fiducial marker is utilized to track construction of the physical structure;
means for identifying each of the plurality of fiducial marker in association with a unique identifier and a location on the physical structure; and
means for utilizing the identified fiducial markers to align image data of the physical structure to the computer model of the physical structure.

31. The system of claim 30 further comprising:
means for using machine learning techniques to align a coordinate system of the plurality of fiducial markers to a coordinate system of the computer model.

32. The system of claim 30, wherein at least some of the plurality of fiducial markers are identical to each other but each fiducial marker has a unique association to a spherical 2D image, a location in a spherical image, or to an object in a spherical 2D image such that each fiducial marker is distinguishable from any other fiducial marker based on its unique association.

* * * * *